(12) United States Patent
Kadri et al.

(10) Patent No.: US 9,160,347 B1
(45) Date of Patent: Oct. 13, 2015

(54) SYSTEM AND METHOD FOR COUNTERING THE EFFECTS OF MICROPHONICS IN A PHASE LOCKED LOOP

(71) Applicant: SYMBOL TECHNOLOGIES, INC., Schaumburg, IL (US)

(72) Inventors: Irfan Kadri, Mississauga (CA); Chu Pang Alex Ng, Markham (CA)

(73) Assignee: Symbol Technologies, LLC, Holtsville, NY (US)

( * ) Notice: Subject to any disclaimer, the term of this patent is extended or adjusted under 35 U.S.C. 154(b) by 0 days.

(21) Appl. No.: 14/454,190

(22) Filed: Aug. 7, 2014

(51) Int. Cl.
*H03L 7/06* (2006.01)
*H03L 7/08* (2006.01)

(52) U.S. Cl.
CPC ........................................ *H03L 7/08* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 4,091,232 A | 5/1978 | Lenk et al. | |
| 4,360,834 A | 11/1982 | Schmale et al. | |
| 5,144,254 A * | 9/1992 | Wilke | 327/107 |
| 5,414,741 A * | 5/1995 | Johnson | 375/376 |
| 5,920,556 A * | 7/1999 | Jorgensen | 370/350 |
| 6,091,356 A | 7/2000 | Sanders et al. | |
| 7,038,507 B2 * | 5/2006 | Williams | 327/156 |
| 2004/0135639 A1 | 7/2004 | Maneatis | |
| 2005/0285692 A1* | 12/2005 | Mattila et al. | 331/175 |
| 2008/0117614 A1 | 5/2008 | Qin et al. | |
| 2011/0204936 A1* | 8/2011 | Brenndorfer | 327/156 |
| 2011/0241626 A1* | 10/2011 | McPherson | 320/158 |
| 2013/0113533 A1* | 5/2013 | Aaltonen et al. | 327/147 |
| 2015/0097729 A1* | 4/2015 | Subburaj et al. | 342/357.69 |

FOREIGN PATENT DOCUMENTS

| | | | |
|---|---|---|---|
| EP | 60845 B1 | 2/1986 | |
| EP | 1022856 A2 | 7/2000 | |
| JP | 05187442 A * | 7/1993 | F16C 32/04 |
| WO | 9941838 A1 | 8/1999 | |
| WO | 2005002069 A2 | 1/2005 | |

* cited by examiner

*Primary Examiner* — Adam Houston

(57) ABSTRACT

A method and apparatus for operating an electronic device is provided. The electronic device, which includes a phase lock loop (PLL) receives sensor indicators from at least one sensor. Upon receiving sensor indicators, the device identifies a motion indicator based on the sensor indicators. A parameter of the PLL is adjusted based on the motion indicator, the PLL having at least one component susceptible to microphonics. When the PLL includes a charge pump, a parameter that may be adjusted is a pump current of the charge pump. When the PLL further comprises an oscillator for generating a reference signal, the parameter that may be adjusted is a trim of the oscillator.

20 Claims, 4 Drawing Sheets

SYSTEM AND METHOD FOR COUNTERING THE EFFECTS OF MICROPHONICS IN A PHASE LOCKED LOOP

BACKGROUND OF THE INVENTION

A phase lock loop (PLL) is a control system that generates an output signal whose phase and/or frequency is related to the phase of an input signal. While there are several differing types, in some implementations, a PLL may be formed of an electronic circuit consisting of a frequency oscillator providing a periodic input signal or a reference signal, a controlled oscillator that generates an output signal and a comparator. To enable the comparator to perform a comparison, the output signal is typically fed back toward the reference signal, creating a feedback loop. The comparator thus compares the phase of the reference signal with the phase of the feedback signal and causes the controlled oscillator to be regulated to keep the phase of the reference and output signals synchronized or locked.

The reference and output signal frequencies may also be related. Consequently, in addition to synchronizing signal phases, a phase-locked loop may track a reference frequency, or generate a frequency that is related to, such as being a multiple of, the input frequency. These properties of a PLL allows it to be applied to variety of uses including computer clock synchronization, signal demodulation, frequency synthesis and frequency locking.

In some implementations, components of a PLL may be subject to microphonics, where the electrical behavior of the components may change in response to mechanical motion such as mechanical vibrations. For example frequencies generated by some oscillators and controlled oscillators may vary in response to mechanical vibration. The change in electrical behavior of components may thus degrade or impair the performance of a PLL. Accordingly, there is a need for a system and method for countering the effects of microphonics in a phase locked loop.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
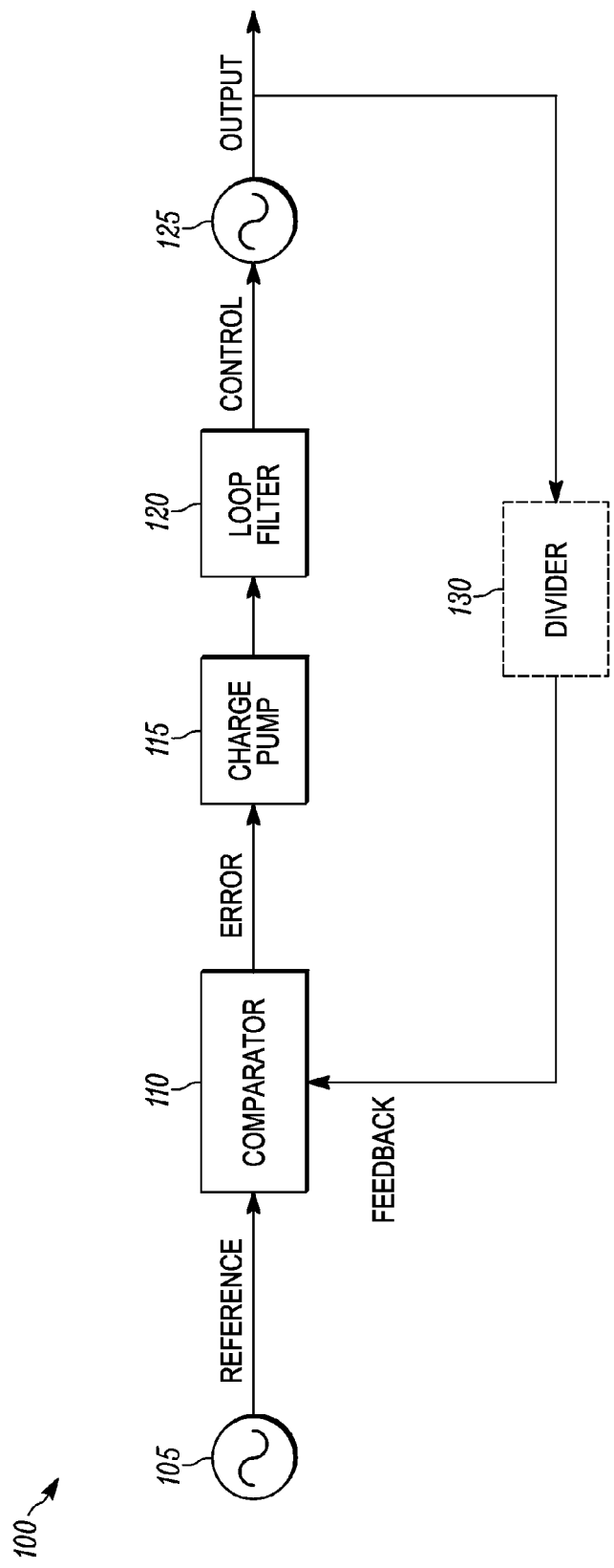
FIG. 1 is a block diagram of a phase lock loop in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

An apparatus and method of operating an electronic device is provided. In operation, the electronic device receives sensor indicators from at least one sensor. Upon receiving sensor indicators, a motion indicator based on the sensor indicators is identified and a parameter of a phase lock loop (PLL) of the device is adjusted based on the motion indicator, the PLL having at least one component susceptible to microphonics.

FIG. 1 is a block diagram of a phase lock loop (PLL) 100 in which methods and components required for a system and method for countering the effects of microphonics in a phase locked loop is implemented in accordance with the embodiments. An oscillator 105 generates a reference signal. A comparator 110 compares two input signals, in this implementation, the reference signal being one input signal and a feedback signal based on the PLL output being the other input signal, and produces an error signal which is proportional to the phase and optionally frequency difference between the two input signals being compared. The error signal is then used to drive a charge pump 115 which is used to control a controlled oscillator 125 through a loop filter 120. The controlled oscillator 125 creates an output signal. In variations, the error signal itself may form the useful output of the PLL.

The output signal is fed through an optional divider 130 back to the comparator 110 forming the feedback signal and producing a feedback loop. Accordingly, when the output signal phase and/or frequency drifts in one direction, the error signal may change, driving the output signal phase and/or frequency in the opposite direction so as to reduce an error, which is typically proportional to the phase and optionally frequency difference between the two input signals being compared by the comparator 110. Thus the output signal phase and/or frequency may be effectively locked to the phase and/or frequency of the reference signal. Depending on the application, either the output of the controlled oscillator 125, or the control signal to the controlled oscillator 125, may provide the useful output of the PLL 100.

The PLL 100 may be implemented using analog and/or digital components. Analog PLLs are generally built with an analog comparator, loop filter and controlled oscillator placed in a feedback configuration. A digital PLL typically uses digital components.

Referring again to FIG. 1, the oscillator 105 generates a reference signal. The oscillator 105 may be realized as an oscillator suitable for generating a reference signal at a desired frequency. For example, the oscillator may be a crystal oscillator such as a calibrated dual crystal oscillator, evacuated miniature crystal oscillator, global positioning disciplined oscillator or an equivalent. In this example implementation of the PLL 100, the oscillator 105 is a temperature compensated crystal oscillator (TCXO) configured to generate a reference signal at 10 Megahertz (MHz). In some variations, the frequency of the reference signal generated by the oscillator 105 may be varied by adjusting the trim or by trimming the oscillator 105 through a trim signal provided to the oscillator 105. In further variations, a divider, a multiplier or a mixer (or a combination of these elements, none of which are shown in FIG. 1) may also be present in the reference signal path. For example a multiplier may make the PLL's output signal frequency a multiple (integer or non-integer) of the reference frequency. In some variations, for example where two PLLs are cascaded, the reference signal may be the output of another PLL.

Continuing with FIG. 1, the comparator 110's operation enables the phase and optionally frequency differences in the loop to be detected and a resultant error signal to be produced. The two inputs of the comparator 110 are the reference input provided by the oscillator 105 and the feedback input obtained, directly or indirectly, from the controlled oscillator 125. The error output generated by the comparator 110 causes the controlled oscillator 125 to be regulated such that the phase and/or frequency difference between its two inputs is held stable. Different types of comparators may be used in different implementations. For example, some comparators are sensitive to just phase differences between its inputs, while others are sensitive to frequency and phase differences.

Figure 2:
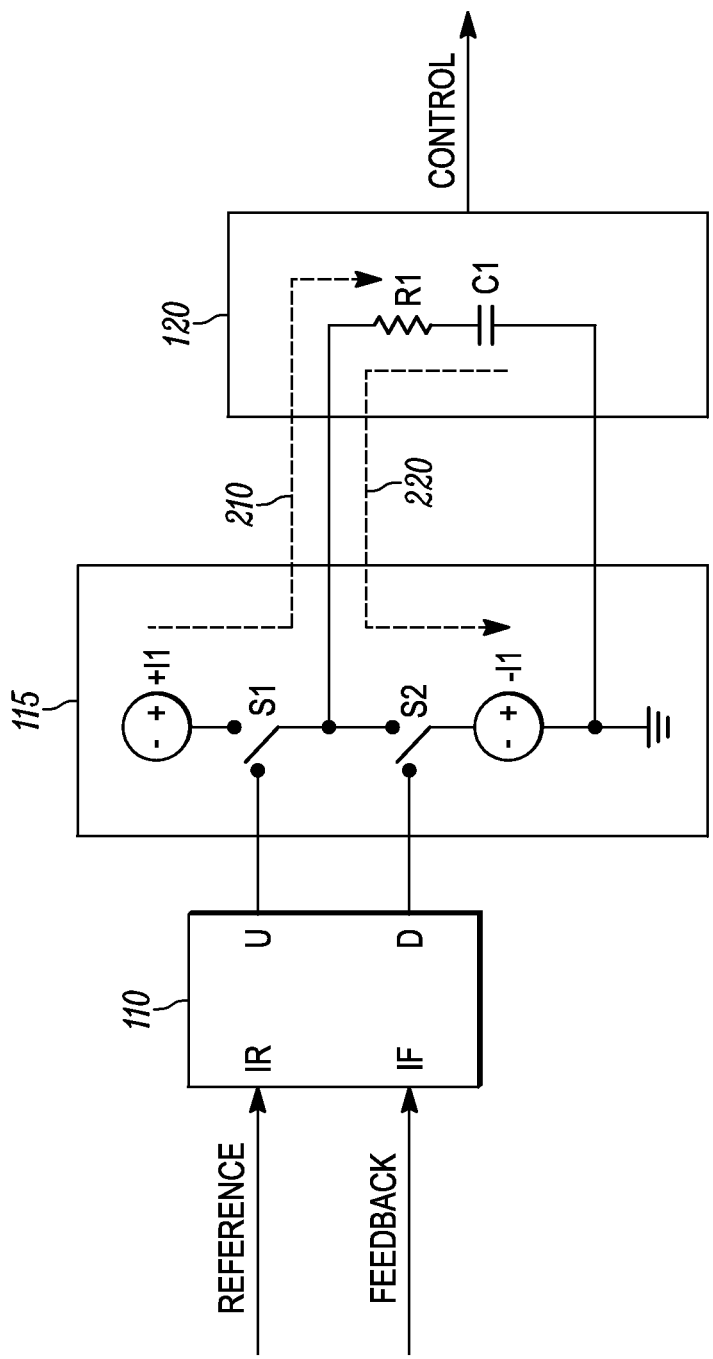
FIG. 2 is a block diagram of a portion of the phase lock loop of FIG. 1 in accordance with some embodiments.

Referring now to FIG. 2, an example implementation of a portion of PLL 100 is shown for illustrative purposes. In this example implementation, for the purposes of illustration, it is presumed that the comparator 110 is a three state comparator. It will be appreciated by those skilled in the art that in other implementations, any suitable comparator may be used. For a three state comparator, when the phase of the reference input (IR) is ahead of the feedback input (IF), the output signal U is turned on (high) while the output signal D is turned off (low). On the other hand, when the phase of the reference input IR lags the feedback input IF, the output signal D is turned on, while output signal U is turned off. As will be explained in greater detail below, the output signal U causes pump current from the charge pump 115 to be positive, whereas the output signal D causes pump current from the charge pump 115 to be negative. When the reference input IR and the feedback input IF match in phase, both output signals U and D are turned off. It should be noted that output signals U and D are not typically turned on at the same time. In some variations, where the comparator 110 is digital for example, the frequency with which a comparison is performed by the comparator 110 may be varied.

In addition to functioning as a phase detector, the example three state comparator may also operate as a frequency detector. This feature may assist with frequency acquisition and may also prevent the loop from locking to higher order harmonics of the reference signal. Accordingly, when the frequency of the reference input IR is higher than the frequency of the feedback input IF, the U output of the comparator 110 is turned on. The resulting average pump current is positive (into the loop filter 120 as indicated at 210) which results in an increase in the output signal frequency generated by the controlled oscillator 125. When the reference input IR frequency is lower than the feedback input IF frequency, the D output of the comparator 110 is turned on. The resulting average pump current is negative (out of the loop filter 120 as indicated at 220) and causes a decrease in the frequency of the output signal generated by the controlled oscillator 125.

Continuing with FIG. 2, the charge-pump 115, in a simplified illustrative example as shown in FIG. 2 may comprise current sources I1 and −I1. Current source I1 is connected to a positive supply rail (not shown) while −I1 is connected to a negative supply rail. The current sources I1 and −I1 are separated by two switches S1 and S2 respectively. The output of the comparator 110 provides the gating signals U (up) and D (down) which turn on S1 and S2 respectively. The comparator 110 is typically designed such that switches S1 and S2 are not on simultaneously. When signal U is high and signal D is low then S1 is turned on and S2 is turned off which causes a pump current to flow out of the pump 115 and into the loop-filter 120 as indicated at 210. When signal U is low and signal D is high the switch S1 is turned off and switch S2 is turned on which causes a pump current to flow out of the loop filter 120 as indicated at 220.

In the present illustrative example of FIG. 2, the two current sources +I1 and −I1 are considered to be symmetric and thus the magnitude of the pump current supplied by the two sources are equal, although in variations, the magnitudes may be different. Moreover, in the present example, the pump current magnitudes may be selectively changed during the operation of the PLL 100. For example, both current sources I1 and −I1 may be variable current sources, the magnitude of the supplied current by each source being controlled by a controller such as a processor. As an example, the controller may vary a voltage input to the current source as a means of controlling the magnitude of the pump current. In variations, other mechanisms for selectively varying the pump current magnitude for each current source I1 and −I1 are possible.

Continuing with FIG. 2, the loop-filter 120, as a simplified example, may be a simple passive filter including a resistor R1 and a capacitor C1. When switch S1 is turned on as a result of the signal U being turned on, charge flows from the current source into capacitor C1 as indicated at 210 forming the pump current. When switch S2 is turned on as a result of the signal D being turned on, charge flows out of the capacitor C1 as indicated at 220. Accordingly, loop filter 120 outputs a filtered control signal based on the error signal generated by the comparator 110.

One purpose of the loop filter 120 is to average the error signal from the comparator 110. The loop filter 120 may remove, for example, any unwanted high frequency components which pass out of the comparator 110 and appear in the controlled oscillator 125 control signal. When such unwanted signals were not filtered, they could then appear on the output of the controlled oscillator 125 as spurious signals.

The loop filter 120 may also affect the ability of the loop to change frequencies quickly. When the loop filter 120 has a very low cut-off frequency then the controlled oscillator 125 may not be able to change its frequency as fast. This may be because a filter with a low cut-off frequency may only let low frequencies through and these correspond to slow changes in voltage level. A loop filter 120 with a higher cut-off frequency, on the other hand, may enable the changes to happen faster.

Referring back to FIG. 1, phase-locked loop 100 also includes a controlled oscillator 125 with a variable frequency capability. The controlled oscillator 125 may be realized as an oscillator suitable for generating an output signal at a desired frequency. Accordingly, the controlled oscillator 125 may be implemented, for example, as an analog oscillator either driven by analog circuitry or digital circuitry through the use of a digital-to-analog converter. In this example, the controlled oscillator 125 is a voltage controlled oscillator (VCO) configured to generate an output signal in the vicinity of 450 MHz based on the voltage based control input received from the loop filter 120.

The controlled oscillator 125 generates a periodic output signal based on the control signal it receives. In this example, the target for the controlled oscillator 125 is to generate an output signal at 45 times the frequency of the reference signal. When the phase and optionally the frequency of the output signal generated by controlled oscillator 125 falls behind that of the reference signal, the comparator 110 causes the control signal to vary such that that the output signal speeds up and optionally increases in frequency. Likewise, when the phase and optionally the frequency of the output signal moves ahead of the reference signal, the comparator 110 causes the control signal to vary such that that the output signal slows down and optionally decreases in frequency. The control input that causes variations in phase and optionally frequency of the output signal may, for example, be current and/or voltage based depending on the type of controlled oscillator used.

Referring to FIG. 1, the example PLL 100 includes an optional divider 130 in the feedback path. Accordingly, in this example implementation of PLL100, the frequency of the output signal is reduced from the vicinity of 450 MHz to the vicinity of 10 MHz which is the frequency of the reference signal. Different types of dividers may be used when implementing a PLL. For example, a programmable divider is particularly useful in radio applications, such as transmit and receive applications, since a large number of transmit/receive frequencies may be produced from a single stable, accurate, but expensive, quartz crystal—controlled reference oscillator.

It should also be noted that the feedback path is not limited to a frequency divider. One or more other elements such as a frequency multiplier or a mixer may be included instead. A multiplier, for example, may allow the output signal frequency to be a fraction (rather than a multiple) of the reference signal frequency. A mixer, on the other hand, may translate the output signal frequency by a fixed offset. Alternatively, a feedback path may include a combination of these elements, an example being a divider following a mixer, allowing the divider to operate at a much lower frequency than the output signal without a loss in the loop gain. In further variations, there may not be any elements in the feedback path.

In general, PLLs may be used widely in various applications including telecommunications, computers and other electronic devices. One particularly important application involves radios. For example, a direct-conversion receiver (DCR) is a radio receiver architecture that demodulates the incoming radio signal using detection driven by a local oscillator whose frequency is identical to, or very close to the carrier frequency of the carrier signal. Alternatively, a super heterodyne receiver may be used after an initial conversion of the carrier frequency by a local oscillator whose frequency is at an offset (i.e. an intermediate frequency) of the carrier signal. Accordingly, the output signal of PLL 100 may be provided as an input to a frequency mixer in the receiver, for example. Thus, the PLL 100 may be employed to lock the local oscillator frequency to the carrier frequency or an intermediate frequency as desired.

Figure 3:
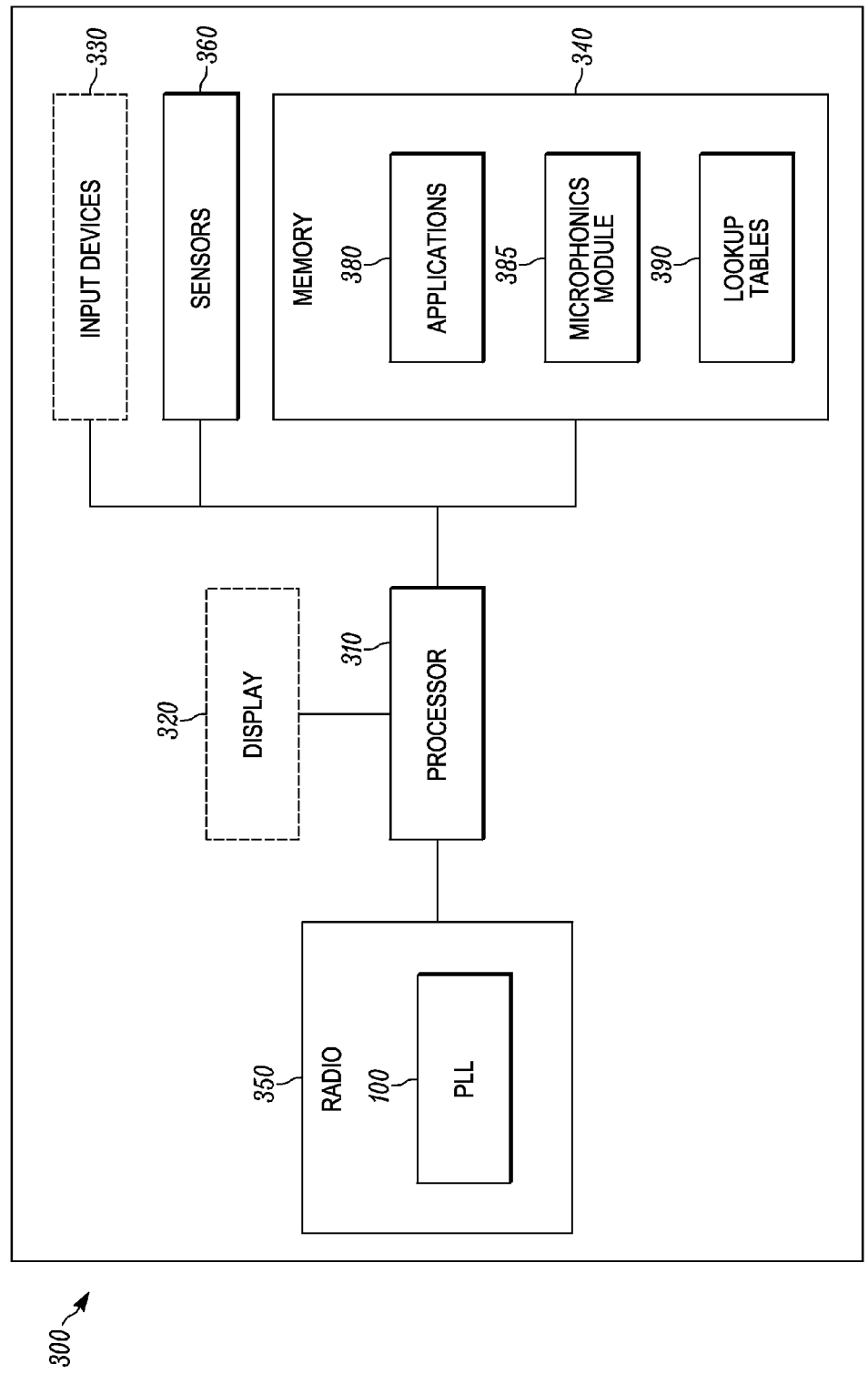
FIG. 3 is a block diagram of a device employing a phase lock loop of FIG. 1 in accordance with some embodiments.

Referring to FIG. 3, a block diagram of an electronic device 300 including a PLL equipped radio is shown. The electronic device 300 may take various forms and may be used in various environments involving mechanical motion such as vibration. For example, the electronic device 300 may take form of, but is not limited to, wearable devices such as finger or head mounted devices, vehicle mounted devices, handheld devices such as a smartphone, a tablet, a bar code scanner, optical code reader and the like, a data capture terminal connected to a handheld device, a desktop, a vehicle mounted device, a laptop or notebook computer, an automated teller machine, a kiosk, a vending machine, a payment machine, facsimile machine, a point of sale device, a vehicle mounted device and the like.

The electronic device 300 comprises a processor 310, an optional display 320, one or more optional input devices 330, memory 340, a radio 350 which utilizes the PLL 100 for signal lock as well as one or more sensors 360. The processor 310 runs or executes operating instructions or applications that are stored in the memory 340 to perform various functions for the electronic device 300 and to process data. The processor 310 may include one or more microprocessors, microcontrollers, digital signal processors (DSP), state machines, logic circuitry, or any device or devices that process information based on operational or programming instructions stored in the memory 340. In variations, electronic device 300 may also include additional components not shown such as output devices including speakers, wired connection capabilities and others. In further variations, one or more of the components shown in FIG. 3 may not be present. For example in some variations the device 300 may not have a display 320 or input devices 330.

The display 320 provides a user interface between the electronic device 300 and a user. The display 320 may be realized as an electronic display configured to graphically display information and/or content under the control of the processor 310. Depending on the implementation of the embodiment, the display 320 may be realized as a liquid crystal display (LCD), a touch-sensitive display, a cathode ray tube (CRT), a light emitting diode (LED) display, an organic light emitting diode (OLED) display, a plasma display, a projection display, or another suitable electronic display. In some embodiments, display 320 may not be present.

The electronic device 300 may also include input devices 330 including touch sensors, buttons or keyboards. Input devices allow the reception of input from external devices such as user fingers, and enable interaction with the electronic device 300.

The sensors 360 detect various physical forces applied to the electronic device 300. For example, motion sensors such as accelerometers and gyroscopes may detect acceleration and changes in orientation respectively. Other sensors 360 such as pressure sensors may detect pressure applied to the housing or display 320 of the electronic device 300. A force sensor may be fabricated using any suitable force sensing technology. The sensors 360 may include further sensors such as magnetometers, and the like. In embodiments, the sensors 360 may be used to detect mechanical vibrations as experienced by the electronic device 300.

The sensors 360 may be placed on or in a portion of the electronic device 300 in predetermined numbers and arrangements. In one non-limiting example, a plurality of accelerometers may be placed on or in the electronic device 300 so as to enable measuring vibrations along an associated plurality of axes. In accordance with such an arrangement, motion of the electronic device 300 may be detected. The plurality of accelerometers, for example, may comprise three accelerometers placed along perpendicular axes to provide for three dimensional motion detection of the electronic device 300. Each device sensor 360 provides indicators of forces detected to the processor 310, which may process the indicators as appropriate to determine motion indicators.

The memory 340 may be an IC (integrated circuit) memory chip containing any form of RAM (random-access memory) or ROM (read-only memory), firmware, a CD-RW (compact disk with read write), a hard disk drive, a DVD-RW (digital versatile disc with read write), a flash memory card, external subscriber identity module (SIM) card or any other non-transitory medium for storing digital information. The memory 340 comprises applications 380, microphonics module 385 and predefined lookup tables 390 corresponding to one or more predefined currents and/or trim values correlated with identified motion indicators. The applications 380 include various software and/or firmware programs necessary for the operation of the electronic device 300 as well as software and/or firmware programs (e.g. communication, email applications etc.) that address specific requirements of the user.

Radio 350 is a wireless radio for establishing wireless connections. For example, the radio 350 may function utilizing any wireless radio frequency channel, for example, a one or two-way messaging channel, a mobile cellular telephone channel, or a mobile radio channel. Similarly, it will be appreciated that the radio 350 may function utilizing other types of communication channels such as Institute of Electrical and Electronics Engineers (IEEE) 802.11, IEEE 802.16 and/or Bluetooth channels. The PLL 100 may be employed in establishing and maintain a radio link as described above. In variations, the electronic device 300 may employ the PLL 100 as part of a circuitry other than or in addition to a radio. In further variations, more than one PLL may be used by the electronic device 300.

In some variations, when the PLL 100 is subjected to mechanical forces such as vibration, the electrical behavior of some of the PLL 100's components may be altered due to microphonics. For example, the frequency produced by crystal oscillators, used for implementing oscillator 115 in some variations, may shift in response to being subjected to mechanical vibration. As a further example, the electrical behavior of ceramic capacitors employed in the PLL 100 may also change when mechanical vibrations are present. Accordingly, the reference signal and/or the feedback signal may both exhibit changes in phase and/or frequency in response to mechanical vibrations. These changes may cause a drift of the reference and feedback signals from a lock condition where the phase and optionally the frequency of the signals are matched. Moreover, when the effects of the mechanical forces are large enough, the PLL 100 may not be able to overcome the out-of-lock condition and thus a receiver using the PLL 100, for example, may not be able to maintain a radio communication link with sufficient quality. Furthermore, the predetermined frequency at which the lock is to be maintained (for example at the carrier signal frequency) may drift as well, and thus the PLL 100 may establish lock at the wrong frequency. In such a case, selectivity and sensitivity may be impaired.

The effect of microphonics on the PLL 100 may be countered by varying certain parameters of the PLL 100. For example, the magnitude of pump current provided by the charge pump 115 may be varied. The magnitude of pump current provided by the charge pump 115 may determine how quickly the capacitor in loop filter 120 is charged, for example, and thus may alter the rapidity of the controlled oscillator 125 response to changes in phase and/or frequency. As an example, an increase in the magnitude of pump current supplied by the charge pump 115 may shorten the lock time (the time it takes to achieve a lock) which may reduce the likelihood of "out-of-lock" condition due to microphonics effect on the controlled oscillator 125. As a result, radio link communication may be maintained. Referring back to FIG. 2, to effect an increase in the magnitude of pump current provided by the charge pump 115, in some variations, the variable current sources I1 and −I1 may be manipulated so as to increase the magnitude of the current supply.

An additional parameter that may be modified for countering the effects of microphonics is the trim for the oscillator 105. Trimming of the oscillator 105 may allow the reference signal to be re-positioned to its correct center frequency, when it has drifted due to microphonics. Not only may this reduce the likelihood of "out-of-lock" condition, but may also improve communication link quality such as sensitivity, selectivity, anti-jammer, and others.

To determine the amount of parameter variation to effectively counter microphonics, tests may be performed. In accordance with these tests, the device 300 (or the PLL 100) may be subjected to mechanical forces that causes microphonic effects. Sensor indicators can be obtained from sensors 360 corresponding to the mechanical forces. Subsequently, one or more motion indicators may be identified characterizing the detected motion resulting from the mechanical forces. For example, the intensity of the vibrations detected may be determined. Alternatively, or in addition, a vibration pattern based on sensor indicators may also be determined To determine PLL parameter values that can effectively counter the effects of microphonics on the electrical behavior of the PLL 100, for each distinct vibration pattern and/or intensity, parameters of the PLL 100 may be varied until the microphonic effects are reduced or eliminated. The resulting motion indicators and corresponding parameter value changes as determined by the tests may be stored in the memory of the electronic device 300, for example in predefined lookup tables 390.

In operation, when the electronic device 300 encounters mechanical forces, the detected motion is identified based on detected motion indicators. Corresponding PLL parameter changes are obtained from the lookup table 390 and applied to the PLL 100. In cases where the motion detected during the operation of the device 300 does not match any of the ones stored in the lookup tables 390, default changes to PLL parameter values may be applied. In variations, no changes may be applied to the PLL 100 parameters when the detected motion is not identified on the basis of the look-up tables 390. In further variations, a predefined intensity threshold may be used and the parameters of the PLL 100 may be modified when the detected vibration intensity exceeds the predefined threshold. In yet further variations, different thresholds may be used for different vibration types as identified by the motion patterns.

It should be noted that although the use of parameter variations to correct for microphonics is discussed in light of device 300 where the PLL 100 is used as part of a radio, such an approach is also applicable for countering the effects of microphonics when the PLL 100 is used in circuits and applications other than radios, such as in microprocessor clock pulse distribution and also where there are more than one PLL in a given circuit or device. Indeed, this approach is applicable to any PLL that has components that are susceptible to microphonics.

Figure 4:
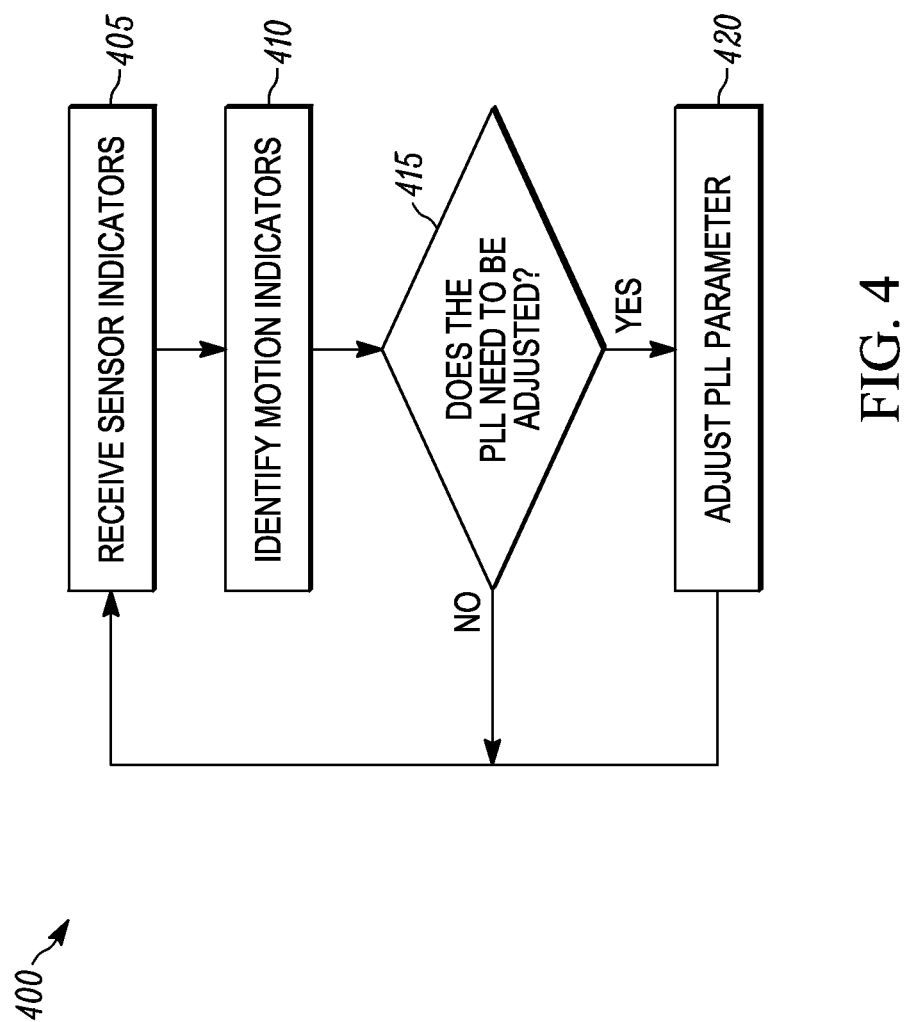
FIG. 4 is a flowchart of a method of countering the effects of microphonics in a phase lock loop in accordance with some embodiments.

FIG. 4 represents a flowchart of a method 400 for countering the effects of microphonics in the PLL 100 of the electronic device 300 of FIG. 3 in accordance with some embodiments. The method may be performed based on hardware and/or software components. For example, the method may be performed by processor 310 executing the microphonics module 385 stored in the memory 340. In variations, the method may be implemented as part of an application specific integrated circuit (ASIC) or in terms of other hardware and/or software combinations.

As shown in FIG. 4, the method 400 begins by receiving sensor indicators from the sensors 360 at block 405 to monitor for motion at electronic device 300. Accordingly, the processor 310 receives indicators of mechanical forces and motion detected by the sensors 360. Sensor indicators may correspond to different mechanical motion and forces to which the electronic device 300 is subjected to. For example, sensor indicators may correspond to vibrations caused by the oscillation of the electronic device 300 as a result of mechanical motions or forces the electronic device 300 is subjected to. The oscillations may be periodic such as the motion of a clock pendulum or random such as the roll of a wheel on a gravel road. The electronic device 300 may be subjected to vibrations due to number of different environmental conditions.

For example, the electronic device 300 may be mounted on (or placed in) a vehicle such as a car or a fork lift travelling over uneven terrain and/or including engine vibration. Alternatively, the electronic device 300 may be mounted on portions of buildings which include sources of mechanical vibration such as large motors or compressors such as air conditioners or electric generators.

At Block 410, one or more indicators of motion are identified on the basis of the received sensor indicators. For example, an intensity of motion, such as the magnitude or intensity of a vibration may be identified on the basis of the sensor indicators. Various methods may be used to determine motion intensity, including oscillation amplitude of a vibration. As a further example of identifying motion indicators, a motion pattern such as a vibration pattern identifying a type of motion may be obtained based on the sensor indicators.

At Block 415, a determination is made as to whether the PLL should be adjusted in light of the one or more motion indicators determined at block 410. For example, the determination may be made on the basis of whether the magnitude or intensity of the detected vibration occurring at device 300 is greater than a predetermined threshold. When the intensity is found to be below a predetermined threshold, the monitoring of the device for mechanical motion continues at block 405. When the vibration intensity is determined to be above a predetermined threshold, however, at block 420 one or more of the PLL 100's parameters are varied. As a further example, the determination may also be made on the basis of whether the identified vibration pattern is known as determined by matching the obtained vibration pattern to one stored in the memory 340, such as in the lookup tables 390. When the vibration pattern is not found in the memory 340, the monitoring of the device for mechanical motion continues at block 405. When the vibration pattern is found in the memory 340, however, at block 420 one or more of the PLL 100's parameters are varied.

At block 420 one or more PLL parameters are adjusted. For example, the pump current provided by the charge pump 115 may be modified. Alternatively, or in addition, the oscillator 105 may be trimmed through a trim signal, varying the frequency of the reference signal. The change in the magnitude of current or the frequency of the reference signal may be based on one or more motion indicators identified. For example, the vibration intensity determined at block 415 may be used to select or calculate a parameter change magnitude. Alternatively, or in addition, the vibration pattern determined at block 415 may be used to identify the change magnitudes. For example, vibration intensity and/or pattern may be used to identify corresponding predefined change magnitudes from the look up tables 390. Moreover, the parameters to vary may also be selected on the basis of the of the motion indicators. For example, for some vibration intensities only the pump current may be altered, whereas for others, the oscillator 105 may also be trimmed Once the PLL parameter (or parameters) is adjusted, the processor 310 continues to monitor for motion at block 405.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method of operating an electronic device comprising:
   receiving sensor indicators from at least one sensor;
   identifying a motion indicator based on the sensor indicators; and
   adjusting a parameter of a phase lock loop (PLL) based on the motion indicator, the PLL having at least one component susceptible to microphonics.

2. The method of claim 1 wherein the motion indicator is a vibration intensity.

3. The method of claim 2 wherein adjusting the parameter further comprises adjusting the parameter when the vibration intensity is greater than a predefined threshold.

4. The method of claim 1 wherein the PLL includes a charge pump and the parameter is a pump current of the charge pump.

5. The method of claim 4 wherein adjusting further comprises increasing the magnitude of the pump current.

6. The method of claim 5 wherein the magnitude of increase of the pump current is based on the motion indicator.

7. The method of claim 6 wherein the magnitude of increase of the current supplied is obtained from a memory of the device, based on the motion indicator.

8. The method of claim 1 wherein the PLL further comprises an oscillator for generating a reference signal and the parameter is a trim of the oscillator.

9. The method of claim 8 wherein the magnitude of the trim is based on the motion indicator.

10. The method of claim 1 further comprising:
    selecting the parameter to be adjusted based on the motion indicator.

11. An electronic device comprising:
    at least one sensor;
    a phase lock loop (PLL) having at least one component susceptible to microphonics;
    a memory; and
    a processor connected to the at least one sensor, the memory and the PLL, the processor operating to:
    receive sensor indicators from the at least one sensor;
    identify a motion indicator based on the sensor indicators; and
    adjust a PLL parameter based on the motion indicator.

12. The electronic device of claim 11 wherein the motion indicator is a vibration intensity.

13. The electronic device of claim 12 wherein adjusting the PLL parameter further comprises adjusting the PLL parameter when the vibration intensity is greater than a predefined threshold.

14. The electronic device of claim 11 wherein the PLL includes a charge pump and the PLL parameter is a pump current of the charge pump.

15. The electronic device of claim 14 wherein adjusting further comprises increasing the magnitude of the pump current.

16. The electronic device of claim 15 wherein the magnitude of increase of the pump current is based on the motion indicator.

17. The electronic device of claim 16 wherein the magnitude of increase of the current supplied is obtained from a memory of the device, based on the motion indicator.

18. The electronic device of claim 11 wherein the PLL further comprises an oscillator for generating a reference signal and the PLL parameter is a trim of the oscillator.

19. The electronic device of claim 18 wherein the magnitude of the trim is based on the motion indicator.

20. The electronic device of claim 11 wherein PLL parameter to be adjusted is selected on the basis of the motion indicator.

* * * * *